(12) United States Patent
Bhattacharya et al.

(10) Patent No.: US 6,774,698 B1
(45) Date of Patent: Aug. 10, 2004

(54) VOLTAGE TRANSLATOR CIRCUIT FOR A MIXED VOLTAGE CIRCUIT

(75) Inventors: Dipankar Bhattacharya, Macungie, PA (US); Makeshwar Kothandaraman, Emmaus, PA (US); John Christopher Kriz, Palmerton, PA (US); Bernard Lee Morris, Emmaus, PA (US); Stefan Allen Siegel, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/354,883

(22) Filed: Jan. 30, 2003

(51) Int. Cl.[7] ................................................ H03L 5/00
(52) U.S. Cl. ........................ 327/333; 327/112; 326/68; 326/81
(58) Field of Search ................................. 327/333, 108, 327/112, 427, 434, 581; 326/68, 80, 81

(56) References Cited

U.S. PATENT DOCUMENTS

| | | | | |
|---|---|---|---|---|
| 4,486,670 A | * | 12/1984 | Chan et al. | .................... 326/81 |
| 6,064,229 A | * | 5/2000 | Morris | ......................... 326/81 |
| 6,091,351 A | * | 7/2000 | Shimomura | ................... 326/68 |
| 6,351,173 B1 | * | 2/2002 | Ovens et al. | ................ 327/333 |
| 6,614,283 B1 | * | 9/2003 | Wright et al. | ................ 327/333 |
| 2003/0011418 A1 | * | 1/2003 | Nishimura et al. | ......... 327/333 |

* cited by examiner

Primary Examiner—Long Nguyen
(74) Attorney, Agent, or Firm—Nancy R. Gamburd

(57) ABSTRACT

An apparatus is disclosed for translating a lower voltage signal, utilized in a low voltage integrated circuit, to a higher voltage signal suitable for use in a high voltage circuit. The apparatus includes a low voltage transistor assembly capable of operating in response to the lower voltage signal; a voltage regulator which is configured to limit an applied voltage across the low voltage transistor assembly; and a high voltage converter which is responsive to the operation of the low voltage transistor assembly to generate the higher voltage signal. The voltage regulator includes a reference voltage generator and a voltage limiter.

26 Claims, 3 Drawing Sheets

US 6,774,698 B1

VOLTAGE TRANSLATOR CIRCUIT FOR A MIXED VOLTAGE CIRCUIT

TECHNICAL FIELD

The present disclosure relates to voltage translation circuits, and, in particular, to an apparatus for providing voltage translation for a mixed voltage circuit.

BACKGROUND

Integrated circuits (ICs) are being developed which contain core logic that operates at comparatively low voltages. At the same time, this core logic must interface with output buffer circuits that generally operate at higher voltages to provide greater output current and higher output voltages. To accommodate such a voltage difference, voltage translator circuits are often used in order to translate the low voltage output from the core logic to the higher voltage required for operation of the higher voltage circuits, for example, output buffer circuits.

Recent developments in IC design and fabrication have resulted in the core logic of ICs having even lower voltage requirements. As the voltage level required to drive the core logic decreases to below 1 Volt (V), however, traditional voltage translator circuits are inadequate and result in an erroneous output to the higher voltage circuit. Such inadequacy results because traditional voltage translator circuits operate only as long as the lower voltage (driving the IC core logic) exceeds a minimum threshold voltage, $V_{TH}$, (e.g., 0.7 V to 0.9 V) required to operate "high voltage" transistors commonly used in the voltage translators, generally by at least 300–400 millivolts (mV). The output voltages from modern ICs having the lower voltage IC core logic, however, may not sufficiently exceed the minimum threshold voltage ($V_{TH}$) to sufficiently turn on the higher voltage transistors and thereby compromise voltage translator operation.

For example, core logic is being developed to operate at only 0.9 V. When coupled to a gate of a higher voltage transistor used in standard translation circuits, the 0.9 V output voltage from the core logic is insufficient to turn on such a higher voltage transistor, resulting in anomalous operation.

DETAILED DESCRIPTION OF THE EXEMPLARY EMBODIMENTS

Figure 1:
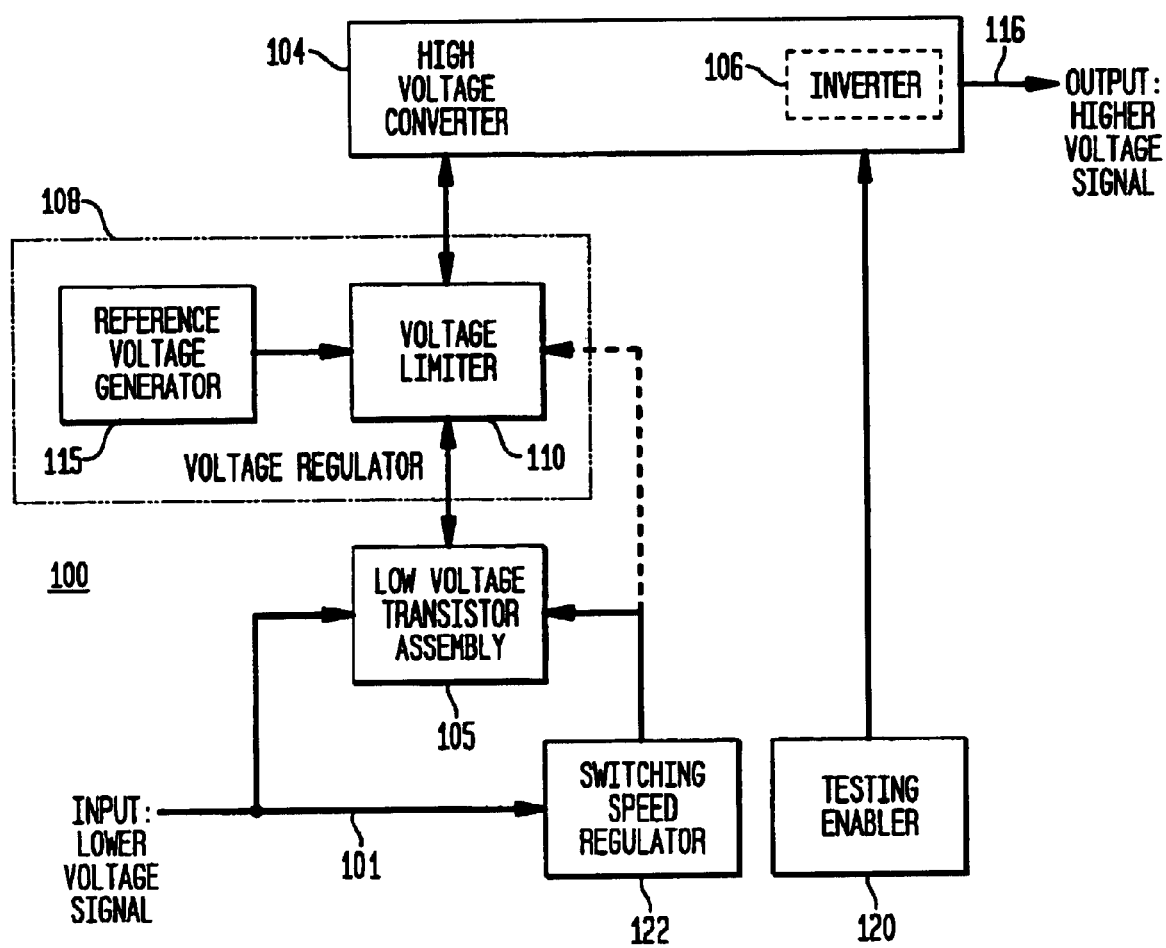
FIG. 1 is block diagram illustrating a voltage translator in accordance with the teachings of the invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

A block diagram of a voltage translator 100 constructed in accordance with the teachings of the invention is illustrated in FIG. 1 in a preferred environment of use, namely, as a voltage translator circuit in a mixed voltage integrated circuit. As used herein, a mixed voltage IC is any circuit that uses at least two different voltages, typically from two different, corresponding power supplies, such as a lower voltage for the core logic and a higher voltage for the output circuitry. For purposes of the present invention, the lower voltage level portion of the mixed voltage IC is generally less than 1.5 V, such as between 0.8 V and 1.2 V, and the higher voltage level portion of the mixed voltage IC is generally greater than 2.5 V, such as between 3.0 V and 3.5 V.

The voltage translator 100 provides translation or conversion of a lower voltage signal, for example, a 0.9 V signal utilized in core logic, to a higher voltage signal, for example, a 3.3 V signal suitable for use by an output buffer circuit. While the block diagram illustrates and explains the voltage translator 100 in the context of that preferred environment of use, the teachings of the invention can similarly be applied in other applications and environments. Therefore, a person of ordinary skill in the art will readily appreciate that any lower voltage circuits, and higher voltage circuits other than output buffers, may be used in connection with voltage translator 100, and that other forms or types of transistors may be utilized in addition to or in lieu of field effect transistors, such as bipolar junction transistors.

As illustrated in FIG. 1, the voltage translator 100 includes a low voltage transistor assembly 105, a high voltage converter 104, and a voltage regulator 108. The high voltage converter 104 may also include an inverter 106. As an option, the voltage translator 100 may also include a switching speed regulator 122 and a testing enabler 120.

The low voltage transistor assembly 105 receives a lower voltage signal as its input (on line or connection 101), such as a lower voltage signal which may be generated by core logic. The high voltage converter 104 is constructed to generate a higher voltage signal, and may utilize an inverter 106 to ensure that the higher voltage signal logically tracks the input lower voltage signal, as discussed below. The voltage regulator 108 is provided to regulate the voltage exposure of the low voltage transistor assembly 105.

In the prior art, traditional voltage translators were typically implemented using "high voltage" n-channel and p-channel transistors. Use of the high voltage transistors proved effective as long as the voltage output from the core logic of the IC exceeded the threshold voltage "$V_{TH}$" (or gate-to-source voltage $V_{GS}$) (e.g., about 0.7 V) of the n-channel transistors in the voltage translator, generally by at least 300–400 mV. As previously mentioned, however, many modern ICs, implemented using "low voltage" n-channel and p-channel transistors, operate at voltages that may be less than 1.0 V, thereby providing an insufficient voltage to meet the threshold voltage $V_{TH}$ (or $V_{GS}$), of higher voltage transistors.

As used herein in the illustrated embodiments, the gate-to-source voltage $V_{GS}$ will generally be equivalent to the threshold voltage $V_{TH}$. The gate-to-source voltage $V_{GS}$ is used, however, as a broader term to include voltage levels which may be greater than the threshold voltage $V_{TH}$. In addition, depending upon the selected embodiment, other voltage levels are also equivalent to gate-to-source voltage $V_{GS}$ for field effect transistors, such as base-to-emitter voltages for bipolar junction transistors. As a consequence, the gate-to-source voltage $V_{GS}$ as used herein should be understood to mean and include any threshold voltage $V_{TH}$ of any type of transistor or any range of similar voltages, as the context may indicate or require.

The voltage translator 100 of FIG. 1 is constructed to accommodate the lower voltage outputs from lower voltage circuits, which are input to the voltage translator 100 via the low voltage transistor assembly 105. In general, the low voltage transistor assembly 105 will utilize one or more low voltage transistors (e.g., 1–1.5 V transistors) which are similar to those used in the low voltage core logic of an IC, enabling the low voltage transistor assembly 105 to provide a suitable voltage match between the voltage translator 100 and the lower voltage signal received from the low voltage core logic.

Care should be taken in use or operation of the low voltage transistor assembly 105 in the illustrated example, however, to avoid exposure of the low voltage transistor assembly 105 to higher circuit voltages, which could burn out and literally destroy the low voltage transistor assembly 105. More particularly, the low voltage transistors typically have a maximum rated voltage which may be applied between the source and drain of the transistor, "$V_{DS}$" (or, equivalently, a collector-to-emitter voltage). As a consequence, voltage protection is provided by the voltage regulator 108 to ensure that the low voltage transistors are not voltage stressed or otherwise harmed by an excessive applied voltage. Therefore, the voltage regulator 108 is configured to limit possible stress voltages (as drain-to-source voltages (or $V_{DS}$)) that may be applied to the low voltage transistor assembly 105.

Operation of the voltage regulator 108 is enabled by a voltage limiter 110 and a reference voltage generator 115. The reference voltage generator 115 provides a pre-selected or predetermined reference voltage to the voltage limiter 110. Based on the value of the pre-selected reference voltage and the configuration of the voltage limiter 110, exposure of the low voltage transistor assembly 105 to higher voltages is limited. In the exemplary embodiments, the value of the reference voltage is selected (discussed below in connection with FIG. 2) to achieve two purposes: (1) to ensure that the low voltage transistors are not voltage stressed, limiting the $V_{DS}$ of the low voltage n-channel transistors to between about 0.6 V to 1.1 V; and (2) at the same time, to ensure that high voltage transistors (e.g., 3.3 V transistors) of the voltage limiter 110 operate at or above their corresponding threshold voltages, $V_{TH}$ (or, equivalently, $V_{GS}$).

In the illustrated example, the high voltage converter 104 is coupled to the voltage limiter 110 to provide a higher voltage signal (output on line, node or connection 116) substantially equivalent to either the higher voltage (e.g., 3.3 V, less any voltage drop due to a transistor), for a first logic state (such as a logic one or high), or a ground potential voltage (e.g., 0 V), for a second logic state (such as a logic zero or low), in response to the operation of the low voltage transistor assembly 105. Depending on the selected embodiment, an inverter 106 will be utilized within the high voltage converter 104, such that the output higher voltage signal directly follows the input lower voltage signal (i.e., a high (or logic one) lower voltage input provides a high (or logic one) higher voltage output, and a low (or logic zero) lower voltage input provides a low (or logic zero) higher voltage output). The higher voltage signal provided as the output from the voltage translator 100 is then either substantially equivalent to the higher voltage (e.g., of a higher voltage power supply) or substantially equivalent to a ground potential (voltage), i.e., substantially equivalent to either the higher voltage power supply voltage or the ground potential plus or minus any differences (or drops) due to any intervening transistors. Thus, when an appropriate lower voltage signal is received by the low voltage transistor assembly 105, the voltage translator 100 provides a higher voltage signal (or a corresponding logic state, such as a high state or a low state) for use in a higher voltage circuit such as an output buffer.

The voltage translator 100 may also include a testing enabler 120 for use, among other things, for testing for current leakage and other defects in an overall IC (of which the voltage translator 100 is a part). In addition, the voltage translator 100 may include a switching speed regulator 122 for increasing the switching speed of the voltage translator 100 (and, more particularly, for increasing a low to high transition of the low voltage transistor assembly 105).

Figure 2:
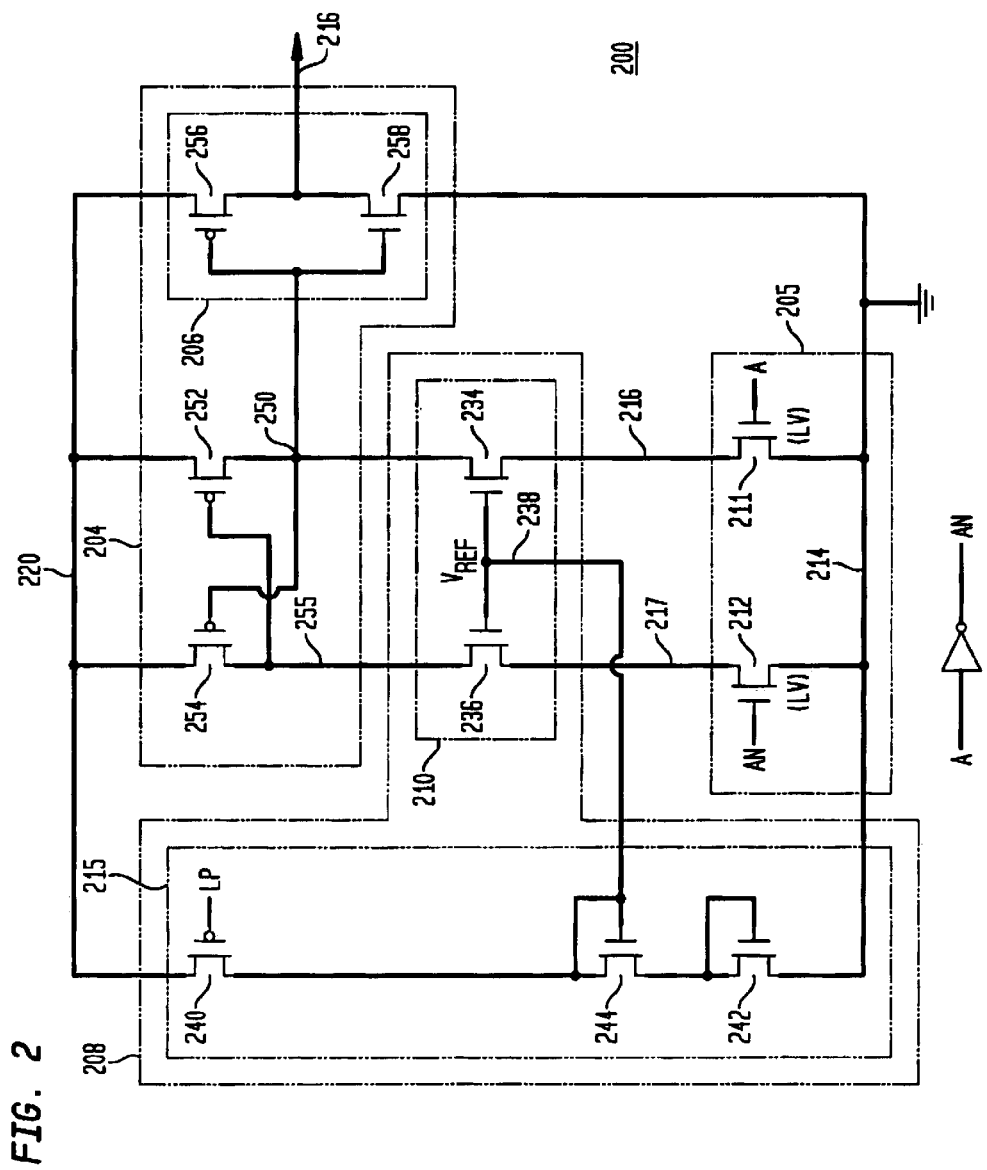
FIG. 2 is a first exemplary voltage translator circuit in accordance with the teachings of the invention.

As will be appreciated by those of ordinary skill in the art, the voltage translator 100 may be implemented in a number of ways, using any type of transistor or equivalent circuit element. FIG. 2 is a first exemplary embodiment of a voltage translator circuit 200 illustrating an implementation of the exemplary voltage translator circuit 100 of FIG. 1. Like the voltage translator of FIG. 1, the exemplary voltage translator circuit 200 includes a low voltage transistor assembly 205, a high voltage converter 204 (including inverter 206) constructed to generate a higher voltage signal output on node (or line) 216, and a voltage regulator 208 comprised of a voltage limiter 210 and a reference voltage generator 215.

As illustrated, the low voltage transistor assembly 205 is configured using low voltage ("LV") n-channel transistors, such as 1 V transistors (with all other transistors of voltage translator circuit 200 implemented using high voltage transistors, such as 3 or 3.3 V transistors). Equivalent circuits may be implemented using low voltage p-channel transistors. In the exemplary voltage translator circuit 200, the low voltage transistor assembly 205 includes a first low voltage n-channel transistor 211 and a second low voltage n-channel transistor 212.

The first low voltage n-channel transistor 211 has a source coupled to a ground potential (voltage) on a node 214, a drain coupled to a node 216, and a gate to receive the lower voltage signal ("A"). The second low voltage n-channel transistor 212 has a source also coupled to node 214, a drain coupled to node 217, and a gate to receive an inverted lower voltage signal ("AN") (i.e., a logical opposite or inverted form of the lower voltage signal "A").

The lower voltage signal "A" used to drive the first low voltage n-channel transistor 211 is a logical opposite to the inverted lower voltage signal "AN" used to drive the second low voltage n-channel transistor 212. When the lower voltage signal "A" is "high" (e.g., substantially about 0.9 V represented by a logic "1"), the first low voltage n-channel transistor 211 is on, thereby "pulling down" node 216 substantially to the ground potential on node 214; correspondingly, the inverted lower voltage signal "AN" is "low" (e.g., substantially about 0 V represented by a logic "0"), and the second low voltage n-channel transistor 212 is off. Conversely, when the lower voltage signal "A" is low, the first low voltage n-channel transistor 211 is off, while the inverted lower voltage signal "AN" is high, the second low voltage n-channel transistor 212 is on, and node 217 is pulled low substantially to the ground potential of node 214.

To avoid harming the low voltage n-channel transistors 211, 212 used in the exemplary voltage translator circuit 200, any voltages generated at nodes 216 and 217 should be limited to less than the maximum rated drain-to-source voltage as applicable to the selected low voltage transistors (e.g., less than a maximum of about 1.3 V for the transistors 211, 212). This voltage limitation ensures that the low voltage n-channel transistors 211,212 are not voltage stressed or otherwise harmed by an excessive drain-to-source voltage ($V_{DS}$) (between nodes 216 and 214 or between nodes 217 and 214). As illustrated, limiting the voltages generated at nodes 216, 217 is performed by the voltage regulator 208.

As previously mentioned in connection with FIG. 1, the voltage regulator 208 includes the voltage limiter 210 and the reference voltage generator 215. Briefly, the voltage regulator 208 ensures that the voltage level at nodes 216 and 217 is never greater than one $V_{GS}$ (gate-to-source voltage) of a higher voltage ("HV") transistor.

This voltage limitation is accomplished by reference voltage generator 215 generating a reference voltage, $V_{REF}$, at node 238, which ($V_{REF}$)is equal to 2 $V_{GS}$ (or, equivalently, 2 $V_{TH}$) (one $V_{GS}$ (or $V_{TH}$) from diode-connected transistor 242 and another $V_{GS}$ (or $V_{TH}$) from diode-connected transistor 244). (It should be noted that the low power input ("LP") is normally set to low, such that p-channel transistor 240 is conducting and functioning as a resistor, as discussed below with reference to FIG. 3)). This reference voltage $V_{REF}$ is applied to the gates of two high voltage n-channel transistors 234 and 236 of the voltage limiter 210 (which, as a consequence, are always in an on state during non-testing operation). As a further consequence, subtracting the respective gate-to-source voltages of transistors 234 and 236 (one $V_{GS}$ (or $V_{TH}$)), the voltages at nodes are 216 and 217 are thereby limited to one $V_{GS}$ (or $V_{TH}$) of a higher voltage ("HV") transistor. (It should be noted that this assumes, both reasonably and realistically, that the $V_{GS}$ (or $V_{TH}$) of each of the transistors 242, 244, 234 and 236 are substantially equal or otherwise substantially equivalent).

The operation of the voltage translator circuit 200 may now be briefly explained. When lower voltage signal "A" is high, transistor 211 is on and conducts, and with transistor 234 conducting (always on), node 250 is pulled down substantially to ground potential. This, in turn, turns on p-channel transistor 254, raising node 255 to a high voltage (substantially equivalent to the power supply voltage at node 220), turning (or keeping) off transistor 252. (As illustrated, transistors 252 and 254 form a cross-coupled latch). The low voltage at node 250 is then inverted by inverter 206, producing a high state (or logical 1) for the higher voltage signal output on line or node 216, substantially equivalent to the higher voltage at node 220 (and corresponding to the logical one or high state of lower voltage signal "A").

Similarly, when lower voltage signal "A" is low (and the inverted lower voltage signal "AN" is high), transistor 211 is off, transistor 212 is on and conducts, and with transistor 236 conducting (always on), node 255 is pulled down substantially to ground potential. This, in turn, turns on p-channel transistor 252, raising node 250 to a high voltage (substantially equivalent to the power supply voltage at node 220), turning (or keeping) off transistor 254. The high voltage at node 250 is then inverted by inverter 206, producing a logical zero or low state for the higher voltage signal output on line or node 216, substantially equivalent to the ground voltage at node 214 (and corresponding to the logical zero or low state of lower voltage signal "A").

Equivalently, the operation of the low voltage transistor assembly 205 (transistors 211 and 212), by conducting or not conducting substantially to the ground potential of node 214, may be considered to generate a low voltage output signal at nodes 216 and 217, respectively, which is transmitted to the high voltage converter 204 via voltage limiter 210. As a consequence, the high voltage converter 204 may be considered either responsive to the operation of the low voltage transistor assembly 205 or responsive to the low voltage output signal.

Several important features of the voltage translator circuit 200 may be readily apparent. First, the voltage translator circuit 200 has translated the lower voltage signal "A" (e.g., 0.9 or 1.0 V) input to the low voltage transistor assembly 205 to a higher voltage signal (e.g., 3 or 3.3 V). Next, the voltage regulator 208 has limited any drain-to-source voltage of the low voltage transistors (211, 212), enabling their use in the voltage translator circuit 200 operating at a higher voltage. Third, the use of n-channel transistors in the voltage regulator 208 (234, 236, 242 and 244) enables a consistent gate-to-source voltage across the various transistors, regardless of processing conditions, resulting in a maximum of one $V_{GS}$ (or $V_{TH}$) as a maximum stress voltage ($V_{DS}$) of the lower voltage transistors (i.e., the $V_{GS}$ (or $V_{TH}$) of one n-channel transistor will generally be the same as (or track) the $V_{GS}$ (or $V_{TH}$) of another n-channel transistor, even if the actual value of the $V_{GS}$ (or $V_{TH}$) is variable depending upon process conditions).

The structure and operation of the voltage translator circuit 200 is explained in greater detail in the following ten (numbered) paragraphs:

1. The voltage limiter 210 includes a first high voltage n-channel transistor 234 and a second high voltage n-channel transistor 236. The gates of the first and second high voltage n-channel transistors 234 and 236 are coupled to the reference voltage generator 215. Accordingly, the first and second high voltage n-channel transistors 234 and 236 are each responsive to the reference voltage $V_{REF}$ (at node 238) via their respective gates.

2. The source of the first high voltage n-channel transistor 234 is coupled to node 216, and the source of the second high voltage n-channel transistor 236 is coupled to node 217. The reference voltage (output or provided on node 238) is selected to provide sufficient voltage to turn on first and second high voltage transistors 234, 236, while not exceeding the maximum rated voltage (for the low voltage transistors 211 and 212) at nodes 216, 217 (i.e., $V_{REF}$ minus the $V_{GS}$ (or $V_{TH}$) of transistors 234, 236 is less than or equal to the maximum rated voltage at nodes 216, 217).

3. The reference voltage generator 215 is preferably constructed to deliver a reference voltage output at node 238 that is substantially equivalent to twice the gate-to-source voltage, ($2V_{GS(HV)}$), of the first (or second) high voltage n-channel transistor 234 (or 236) (or, equivalently, $2V_{TH}$). This selected reference voltage thereby provides that a voltage appearing at the source of the first or second high voltage n-channel transistor 234 or 236 (e.g., node 216 or 217, or, equivalently, the voltage appearing at the drains of the low voltage n-channel transistors 211 and 212) is no greater than one $V_{GS(HV)}$ (or one $V_{TH}$) (i.e., $2V_{GS(HV)}$)–$V_{GS(HV)}$). As this voltage is then the maximum drain-to-source voltage ($V_{DS}$) of the first and second low power n-channel transistors 211 and 212, voltage regulation of the maximum voltage across these transistors is provided.

4. To generate a reference voltage output on node 238 that is substantially equivalent to two times the gate-to-source (or threshold) voltage of either the first or second high voltage n-channel transistors 234, 236, the reference voltage generator 215 includes two diode-connected, high voltage n-channel transistors (third high voltage n-channel transistor 242 and fourth high voltage n-channel transistor 244), which are connected to each other in series. In addition, to provide a low power mode discussed below, the reference voltage generator 215 includes a first high voltage p-channel transistor 240, having a low power (LP) testing mode input to its gate. As the low power (LP) input is set to a low voltage for all non-testing modes (ie., all operating modes), the p-channel transistor 240 is generally on and functions as a resistor. In the event a testing mode is not utilized, p-channel transistor 240 may be omitted and a resistive or other equivalent component substituted instead.

5. The first high voltage p-channel transistor 240 has a source, a gate for testing mode input, and a drain coupled to a first supply voltage on node 220. The first supply voltage on the node 220 may be any "high voltage" suitable for use in the exemplary voltage translator circuit 200 described herein, and will be determined or selected based upon the required high voltage output needed in the translation. In the illustrated example, the first supply voltage may be any voltage greater than 2.5 V, such as between 3.1 V and 3.5 V, and is preferably 3.3 V.

6. The fourth high voltage n-channel transistor 244 has a gate and a drain coupled (i.e., diode-connected) to provide the reference voltage output at node 238. The third high voltage n-channel transistor 242 has a drain and a gate coupled to the source of the forth high voltage n-channel transistor 244, and a source coupled to node 214 (ground potential). General (non-testing or normal) operation of the exemplary voltage translator circuit 200 occurs, inter alia, when the testing mode input is set low (i.e., a logical "0") to ensure that the reference voltage output is substantially equal to $2\ V_{GS(HV)}$ (or $2V_{TH(HV)}$). During all non-testing (general or normal) operation, the third and fourth high voltage n-channel transistors 242, 244 are configured as diodes with the first high voltage p-channel transistor 240 acting as a resistor. In this way, the value of the reference voltage output at node 238 is substantially equivalent to twice the gate-to-source voltages ($2V_{GS}$ or $2V_{TH}$) of the two n-channel transistors 242, 244. In other words, the voltage appearing at nodes 216, 217 is about one $V_{GS(HV)}$ (or one $V_{TH}$), or about 0.75 V maximum, thereby regulating the maximum (drain-to-source) voltage allowed across the low voltage n-channel transistors 211 and 212.

7. The high voltage converter 204 generates a high voltage output on node 250 in response to operation of the low voltage transistor assembly 205 (via voltage limiter 210), which is then inverted by inverter 206 to provide the higher voltage signal on line (or output node) 216. The high voltage converter 204 includes a second high voltage p-channel transistor 252 and a third high voltage p-channel transistor 254 that are cross-coupled to the source of the other (also, via nodes 250 and 255, to the drains of the first and second high voltage n-channel transistors 236 and 234, respectively). Although depicted as a cross-coupled latch in FIG. 2, a person of ordinary skill in the art will appreciate that the high voltage converter 204 may be implemented equivalently using any number of other configurations or structures (and the high voltage converter 204 is not limited to implementations using the cross-coupled latch and inverter as illustrated).

8. The second high voltage p-channel transistor 252 has a drain coupled to node 220 (e.g., the first voltage supply), a source coupled to the drain of the first high voltage n-channel transistor 234, and a gate coupled to the drain of the second high voltage n-channel transistor 236 (also to the source of transistor 254). Similarly, the third high voltage p-channel transistor 254 has a drain coupled to node 220, a source coupled to the drain of the second high voltage n-channel transistor 236 (and to the gate of transistor 252), and a gate coupled to the drain of the first high voltage n-channel transistor 234 (also to the source of transistor 252 and node 250).

9. The second and third high voltage p-channel transistor 252, 254 operate as alternating pull-up transistors (pulling node 250 substantially to 3.3V) in response to the lower voltage signal and corresponding operation of the low voltage transistor assembly 205. Accordingly, during operation of the exemplary voltage translator circuit 200, when the lower voltage signal "A" (at the gate of transistor 211) is substantially equivalent to a high state (ie., a logical "1"), a voltage at the source of the second high voltage p-channel transistor 252 (node 250) is in a low state (i.e., a logic "0" substantially equivalent to the ground potential on node 214 plus any voltage differences across transistors 211 and 234), and the voltage at node 255 is pulled high by transistor 254 (substantially equivalent to the voltage level of the first supply voltage on node 220 minus any voltage drop across transistor 254). In addition, when the lower voltage signal "A" (at the gate of transistor 211) is substantially equivalent to a low state (i.e., a logical "0") (and the inverted lower voltage signal "AN" (at the gate of transistor 212) is substantially equivalent to a high state (i.e., a logical "1")) a voltage at the source of the third high voltage p-channel transistor 254 (node 255) is substantially equivalent to the ground potential on node 214 (plus any voltage differences across transistors 212 and 236), and the voltage at node 250 is pulled high by transistor 252 (substantially equivalent to the voltage level of the first supply voltage on node 220 minus any voltage drop across transistor 252).

10. In other words, when the lower voltage signal "A" is high, node 250 is low, the third high voltage p-channel transistor 254 is on, pulling node 255 high, and the second high voltage p-channel transistor 252 is off. As a result, the voltage at node 250 remains low (via transistors 211 and 234), and following inversion by inverter 206, the high state of the higher voltage signal is provided on line (or output node) 216. Conversely, when the lower voltage signal "A" is low, the first n-channel transistor 211 is off, the second n-channel transistor 212 is on, node 255 is low, the second high voltage p-channel transistor 252 is on, and the voltage on node 250 is "pulled-up" to the higher voltage, and following inversion by inverter 206, the low state of the higher voltage signal is provided on line (or output node) 216.

In summary, when the lower voltage signal is high (and the inverted lower voltage signal is low), the first low voltage n-channel transistor 211 is on and the second low voltage n-channel transistor 212 is off. This turns the third high voltage p-channel transistor 254 on, and turns (or keeps) the second high voltage p-channel transistor 252 off, thereby yielding a voltage on node 250 that is substantially equivalent to the ground potential on the node 214. As a result of operation of the inverter 206, the output on node 216 is substantially equivalent to the high state of the higher voltage signal (i.e., substantially equivalent to the first supply voltage on node 220).

Also in summary, when the lower voltage signal is low (and the inverted lower voltage signal is high), the first low voltage n-channel transistor 211 is off and the second low voltage n-channel transistor 212 is on. This turns the second high voltage p-channel transistor 252 on, and turns (or keeps) the third high voltage p-channel transistor 254 off, thereby yielding a voltage on node 250 that is substantially equivalent to the high voltage on the node 220. As a result of operation of the inverter 206, the output on node 216 is substantially equivalent to the low state of the higher voltage signal (i.e., substantially equal to the ground potential on node 214).

As indicated above, the high voltage converter 204 may be implemented in a wide variety of ways, in addition to the cross-coupled latch illustrated in FIG. 2. Depending upon such an implementation, the inverter 206 may be unnecessary and may be omitted.

Figure 3:
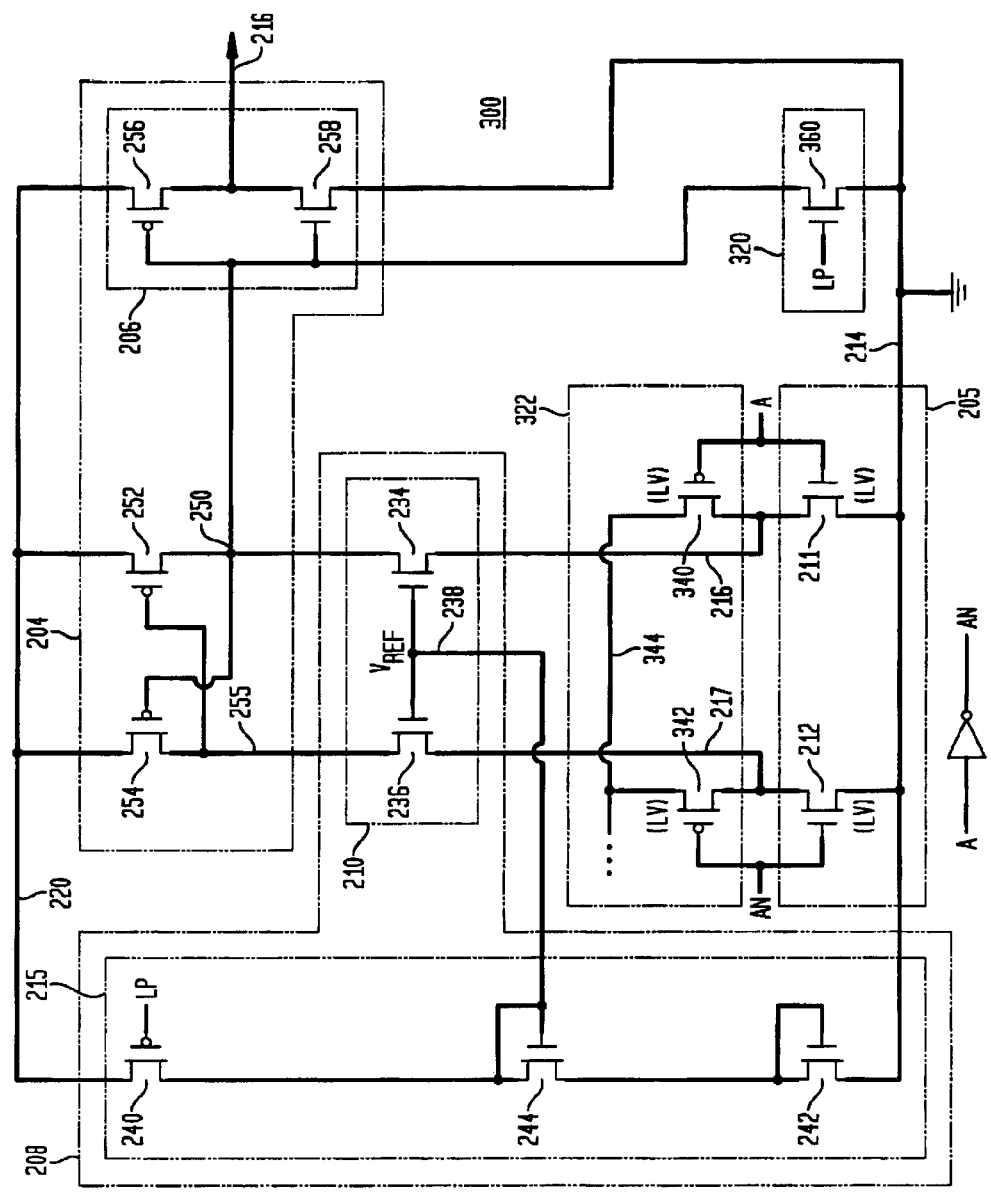
FIG. 3 is a second exemplary voltage translator circuit in accordance with the teachings of the invention.

Referring to FIG. 3, there is shown a second exemplary voltage translator circuit 300 in accordance with the present invention. The exemplary voltage translator circuit 300 includes the same components as the voltage translator circuit 200, namely, a low voltage transistor assembly 205, a high voltage converter 204 (with inverter 206) to provide a higher voltage signal on output node 216, and a voltage regulator 208 (including a voltage limiter 210 and a reference voltage generator 215). In addition to the elements described with reference to the exemplary voltage translator circuit 200 of FIG. 2, the exemplary voltage translator circuit 300 also includes a testing enabler 320 (to enable a low power testing mode) and a switching speed regulator 322.

The low voltage transistor assembly 205 also may be configured using two low voltage n-channel transistors 211 and 212. Differing from the exemplary voltage translator of FIG. 2, however, the drains of the first and second low voltage n-channel transistors 211 and 212 are also coupled to the switching speed regulator 322.

The addition of the switching speed regulator 322 to the exemplary voltage translator 300 facilitates a higher or faster switching speed than that of the exemplary voltage translator circuit 200. The switching speed regulator 304 includes first and second low voltage p-channel transistors 340 and 342 for changing voltages at nodes 216 and 217. During operation, the switching speed regulator 322 increases the switching speed of the voltage translator circuit 300 when either the lower voltage signal or the inverted lower voltage signal transitions from a high state to a low state (e.g., a logical "1" to a logical "0"), such that a corresponding node 216 or node 217 transitions from a low state to a high state. The two low voltage p-channel transistors 340 and 342 facilitate pulling up these nodes 216 or 217 toward the voltage provided on node 344. The voltage on node 344 is provided by a second, low voltage power supply (not separately illustrated), such as a 1–1.5 V power supply suitable for the low voltage transistors (or core logic).

More particularly, the source of the first low voltage p-channel transistor 340 is coupled to the drain of the first low voltage n-channel transistor 211. Similarly, the source of the second low voltage p-channel transistor 342 is coupled to the drain of the second low voltage n-channel transistor 212. In addition, corresponding drains of the first and second low voltage p-channel transistors 340 and 342 are coupled to the second supply voltage provided on node 344, and corresponding gates of the first and second low voltage p-channel transistors 340, 342 are coupled to the lower voltage signal and the inverted lower voltage signal, respectively. In the illustrated example, the second supply voltage (of node 344) is preferably between about 1V and 1.5V, but may be any value suitable for the selected low voltage transistors (and, of course, less than the first supply voltage on node 220 for the higher voltage transistors (e.g., less than 3.3 V).

The switching speed regulator 322 primarily expedites transitions from a lower voltage to a higher voltage at nodes 216 and 217. During operation of the exemplary voltage translator circuit 300, when the lower voltage signal ("A") is in a high state, the first low voltage n-channel transistor 211 is on (while the first low voltage p-channel transistor 340 is off) and transistor 211 quickly pulls the voltage at the node 216 substantially to a ground potential (of node 214). When the lower voltage signal is in a low state, the first low voltage n-channel transistor 211 is off, and the first low voltage p-channel transistor 340 is on. As a result, the voltage at node 216 is substantially equivalent to a second supply voltage (of node 344) and the node 216 is quickly pulled up to this higher voltage (rather than more slowly "floating" up to a higher voltage in FIG. 2).

Similarly, when the inverted lower voltage signal is in a high state, the second low voltage n-channel transistor 212 is on (while the second low voltage p-channel transistor 342 is off) and transistor 212 quickly pulls the voltage at node 217 substantially to a ground potential. When the inverted lower voltage signal is in a low state, the second low voltage n-channel transistor 212 is off, and the second low voltage p-channel transistor 342 is on. As a result, the voltage on node 217 is substantially equivalent to the second supply voltage (of node 344) and node 217 is pulled up quickly. As a consequence, the switching speed of the exemplary voltage translator circuit 300 is increased via use of the first and second low voltage p-channel transistors 340, 342 having drains coupled to the second supply voltage (of node 344).

It should be noted that in the various embodiments, either or both the first or second low voltage p-channel transistor 340, 342 may be utilized to form the switching speed regulator 322, and generally only first low voltage p-channel transistor 340 is needed to form the switching speed regulator 322.

During general (non-testing or normal) operation, the testing mode input "LP" is in a low state (i.e., set to a logical "0"), as previously indicated, and the exemplary voltage translator circuit 300 operates as described above. When testing of the exemplary voltage translator circuit 300 is desired (such as testing for current leakage), a low power (LP) mode is employed via setting the testing mode input (LP) to a high state, thereby turning off all DC current paths throughout the circuit 300. As a result, however, without the testing enabler (320 or 120), the reference voltage on node 238 becomes undefined and tends to float very low, turning off both transistors 234 and 236 (compared with both being on in non-testing operation), resulting in an undesirable unknown or floating state (i.e., neither a high or low state) on node 250 (and node 255). Absent the testing enabler 320, this also results in the higher voltage signal on node 216 being in an unknown state, possibly causing undesirable chattering or oscillation.

Addition of the testing enabler 320 (or 120) eliminates the unknown to states associated with the nodes 250, 255 and 216 which could otherwise occur during testing of the exemplary voltage translator circuit 300. The testing enabler 320 includes a fifth high voltage n-channel transistor 360 having a drain coupled to node 250, a source coupled to node 214, and a gate for input of the testing mode input (or signal) (LP).

During general or normal operation (i.e., all non-testing operating modes), the testing mode input (LP) is set to a low voltage, turning on the first high voltage p-channel transistor 240 of the reference voltage generator 215, and turning off the fifth high voltage n-channel transistor 360 of the testing enabler 320. During low power testing, when the testing mode input (LP) is set to a high state, addition of the fifth high voltage n-channel transistor 360 allows the voltage on the output 216 to remain in a high state (and therefore a predetermined or known state). When the testing mode input is high, the fifth high voltage n-channel transistor 360 is on, the otherwise indeterminate voltage on node 250 is pulled low, and a high voltage p-channel transistor 256 of the inverter 206 pulls the output node 216 to a predetermined (or known) voltage level, which in this case is substantially equivalent to the higher voltage of node 220.

In summary, persons of ordinary skill in the art will readily appreciate that exemplary apparatus embodiments for translating a signal from a lower voltage to a higher voltage have been disclosed. The exemplary apparatus embodiments disclosed herein enable a lower voltage signal from a low voltage IC to be converted to a higher voltage signal suitable for use by a high voltage circuit, such as an output buffer circuit.

Several other important features of the exemplary voltage translator circuits may be readily apparent. The invention has limited any stress voltages of the low voltage transistors, providing for a maximum drain-to-source voltage of the low voltage transistors (of one $V_{GS}$ of a high voltage n-channel transistor), enabling the use of low voltage transistors in voltage translator circuits operating at a higher voltage. Also, the use of n-channel transistors in the voltage regulator of the invention enables a consistent gate-to-source (or threshold) voltage across the various n-channel transistors, independently of processing conditions, resulting in a maximum of one $V_{GS}$ as the maximum stress voltage ($V_{DS}$) of the lower voltage transistors. The invention further provides for a testing mode, without suffering from indeterminate node voltages and corresponding deleterious effects.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. An apparatus for converting a first signal at a first voltage level to a second signal at a second voltage level, the second voltage level comparatively higher than the first voltage level, the apparatus comprising:
   a first voltage level transistor assembly capable of operating in response to the first signal;
   a switching speed regulator coupled to the first voltage level transistor assembly, the switching speed regulator capable of conducting substantially to the first voltage level in response to the first signal;
   a voltage regulator coupled to the first voltage level transistor assembly and configured to limit an applied voltage across the first voltage level transistor assembly;
   a voltage converter coupled to the voltage regulator, the voltage converter responsive to an operation of the first voltage level transistor assembly to generate the second signal; and
   a testing enabler coupled to the voltage converter, the testing enabler capable of providing a predetermined voltage state for the second signal.

2. The apparatus of claim 1, wherein the first voltage level transistor assembly is comprised of a plurality of first voltage level n-channel transistors, a first first voltage level n-channel transistor of the plurality of first voltage level n-channel transistors having a gate coupleable to receive the first signal and a second first voltage level n-channel transistor of the plurality of first voltage level n-channel transistors having a gate coupleable to receive an inverted first signal, the first first voltage level n-channel transistor capable of conducting substantially to a ground potential in response to the first signal and the second first voltage level n-channel transistor capable of conducting substantially to a ground potential in response to the inverted first signal.

3. The apparatus of claim 2, wherein the switching speed regulator comprises a plurality of first voltage level p-channel transistors, the plurality of first voltage level p-channel transistors coupled to the plurality of first voltage level n-channel transistors and further coupled to node having the first voltage level, a first first voltage level p-channel transistor of the plurality of first voltage level p-channel transistors capable of conducting substantially to the first voltage level in response to the first signal and a second first voltage level p-channel transistor of the plurality of first voltage level p-channel transistors capable of conducting substantially to the first voltage level in response to the inverted first signal.

4. The apparatus of claim 2, wherein the switching speed regulator comprises a first voltage level p-channel transistor, the first voltage level p-channel transistor coupled to the first first voltage level n-channel transistor of the plurality of first voltage level n-channel transistor and further coupled to node having the first voltage level, the first voltage level p-channel transistor capable of conducting substantially to the first voltage level in response to the first signal.

5. The apparatus of claim 1, wherein the voltage regulator is configured to provide the applied voltage substantially equal to a gate-to-source voltage ($V_{GS}$) of a second voltage level n-channel transistor.

6. The apparatus of claim 1, wherein the voltage regulator is configured to provide the applied voltage substantially equal to a threshold voltage ($V_{TH}$) of a second voltage level n-channel transistor.

7. The apparatus of claim 1, wherein the voltage regulator comprises:
   a reference voltage generator; and
   a voltage limiter coupled to the reference voltage generator and to the first voltage level transistor assembly.

8. The apparatus of claim 7, wherein the reference voltage generator comprises a plurality of diode-connected, second voltage level n-channel transistors which are coupled in series.

9. The apparatus of claim 8, wherein the plurality of diode-connected, second voltage level n-channel transistors provide a reference voltage to the voltage limiter, and wherein the reference voltage has a third voltage level substantially equal to twice a gate-to-source voltage level ($2V_{GS}$) of a second voltage level n-channel transistor of the plurality of diode-connected, second voltage level n-channel transistors.

10. The apparatus of claim 9, wherein the voltage limiter is configured to provide a voltage drop, from the reference voltage, substantially equal to one gate-to-source voltage level ($V_{GS}$) of the second voltage level n-channel transistor, to form the applied voltage having a fourth voltage level substantially equal to one gate-to-source voltage level ($V_{GS}$) of the second voltage level n-channel transistor.

11. The apparatus of claim 8, wherein the plurality of diode-connected, second voltage level n-channel transistors provide a reference voltage to the voltage limiter, and wherein the reference voltage has a third voltage level substantially equal to twice a threshold voltage level ($2V_{TH}$) of a second voltage level n-channel transistor of the plurality of diode-connected, second voltage level n-channel transistors.

12. The apparatus of claim 11, wherein the voltage limiter is configured to provide a voltage drop, from the reference voltage, substantially equal to one threshold voltage ($V_{TH}$) of the second voltage level n-channel transistor, to form the applied voltage having a fourth voltage level substantially equal to one threshold voltage level ($V_{TH}$) of the second voltage level n-channel transistor.

13. The apparatus of claim 7, wherein the voltage limiter comprises a plurality of second voltage level n-channel transistors having gates coupled to receive a reference voltage from the reference voltage generator.

14. The apparatus of claim 1, wherein the voltage converter comprises:

a cross-coupled latch coupled to the second voltage level; and an inverter having an input coupled to the cross-coupled latch and having an output to provide the second signal.

15. The apparatus of claim 14, wherein the cross-coupled latch is responsive to the operation of the first voltage level transistor assembly to provide a voltage level substantially equal to the second voltage level at the input of the inverter.

16. The apparatus of claim 14, wherein the first voltage level transistor assembly is responsive to the first signal to provide, through the voltage limiter, a voltage level substantially equal to a ground potential at the input of the inverter.

17. An apparatus for converting a first signal at a first voltage level to a second signal at a second voltage level, the second voltage level comparatively higher than the first voltage level, the apparatus comprising:

a first voltage level transistor assembly capable of operating in response to the first signal;

a switching speed regulator coupled to the first voltage level transistor assembly, the switching speed regulator capable of conducting substantially to the first voltage level in response to the first signal;

a reference voltage generator capable of providing a reference voltage having a third voltage level substantially equivalent to twice a threshold voltage level ($2V_{TH}$) of a second voltage level n-channel transistor;

a voltage limiter coupled to the first voltage level transistor assembly and coupled to the reference voltage generator to receive the reference voltage, the voltage limiter capable of providing an applied voltage across the first voltage level transistor assembly substantially limited to one threshold voltage level ($V_{TH}$) of the second voltage level n-channel transistor; and a high voltage converter coupled to the voltage limiter and responsive to an operation the first voltage level transistor assembly to generate the second signal.

18. The apparatus of claim 17, wherein the first voltage level transistor assembly comprises first first voltage level n-channel transistor having a gate coupleable to receive the first signal and a second first voltage level n-channel transistor having a gate coupleable to receive an inverted first signal.

19. The apparatus of claim 18, wherein the switching speed regulator comprises a first voltage level p-channel transistor, the first voltage level p-channel transistor coupled to the first first voltage level n-channel transistor and further coupled to node having the first voltage level, wherein the first voltage level is less than 1.5 Volts.

20. The apparatus of claim 17, wherein the reference voltage generator comprises a plurality of second voltage level n-channel transistors which are coupled in series and wherein each second voltage level n-channel transistor of the plurality of second voltage level n-channel transistors has a coupled drain and gate.

21. The apparatus of claim 17, wherein the voltage limiter comprises a plurality of second voltage level n-channel transistors having gates coupled to receive the reference voltage from the reference voltage generator.

22. The apparatus of claim 17, wherein the voltage converter comprises:

a cross-coupled latch coupled to the second voltage level, wherein the second voltage level is between 3 Volts and 3.5 Volts; and an inverter having an input coupled to the cross-coupled latch and having an output to provide the second signal;

wherein the cross-coupled latch is responsive to the operation of the first voltage level transistor assembly to provide a voltage level substantially equal to the second voltage level at the input of the inverter; and wherein the first voltage level transistor assembly is responsive to the first signal to provide, through the voltage limiter, a voltage level substantially equal to a ground potential at the input of the inverter.

23. The apparatus of claim 22, further comprising:

a second voltage level n-channel transistor coupled to the inverter, the second voltage level n-channel transistor having a gate coupleable to receive a testing enable signal, the second voltage level n-channel transistor responsive to the testing enable signal to provide a voltage level substantially equivalent to a ground potential at the input of the inverter.

24. The apparatus of claim 17, wherein the first signal has a high state less than 1.5 Volts and the second signal has a high state between 2.5 and 3.5 Volts.

25. The apparatus of claim 17, wherein the first signal is provided by a first circuit having an operating voltage below 1.2 Volts, and wherein the second signal is provided to a second circuit having an operating voltage above 3 Volts.

26. An apparatus for translating a first signal at a first voltage level to a second signal at a second voltage level, the second voltage level comparatively higher than the first voltage level, the apparatus coupleable to receive the first signal from a first circuit having a first operating voltage level below 1.5 Volts and coupleable to provide the second signal to a second circuit having a second operating voltage level above 3 Volts, the apparatus comprising:

a first voltage level transistor assembly responsive to the first signal and an inverted first signal to generate a first voltage level output signal;

a switching speed regulator coupled to the first voltage level transistor assembly to increase a rate of transition of the first voltage level output signal from a low state to a high state, the switching speed regulator configured to operate at the first operating voltage level;

a reference voltage generator capable of providing a reference voltage substantially equivalent to twice a threshold voltage level ($2V_{TH}$) of a second voltage level n-channel transistor;

a voltage limiter coupled to the first voltage level transistor assembly and coupled to the reference voltage generator to receive the reference voltage, the voltage limiter capable of providing an applied voltage across the first voltage level transistor assembly substantially limited to one threshold voltage level ($V_{TH}$) of the second voltage level n-channel transistor;

a voltage converter coupled to the voltage limiter and responsive to the first voltage level output signal to generate the second signal, the voltage converter configured to operate at the second operating voltage level; and a testing enabler coupled to the voltage converter to provide a predetermined state of the second signal in response to a testing enable input.

* * * * *